(12) United States Patent
Huang et al.

(10) Patent No.: US 11,482,830 B2
(45) Date of Patent: Oct. 25, 2022

(54) MEASUREMENT METHOD OF REFLECTION SPECTRUM OF VERTICAL CAVITY SURFACE EMITTING LASER DIODE (VCSEL) AND EPITAXIAL WAFER TEST FIXTURE

(71) Applicant: VISUAL PHOTONICS EPITAXY CO., LTD., Taoyuan (TW)

(72) Inventors: Chao-Hsing Huang, Taoyuan (TW); Yu-Chung Chin, Taoyuan (TW); Van-Truong Dai, Vinhphuc province (VN)

(73) Assignee: VISUAL PHOTONICS EPITAXY CO., LTD., Taoyuan (TW)

( * ) Notice: Subject to any disclaimer, the term of this patent is extended or adjusted under 35 U.S.C. 154(b) by 0 days.

(21) Appl. No.: 17/013,965

(22) Filed: Sep. 8, 2020

(65) Prior Publication Data
US 2021/0075185 A1 Mar. 11, 2021

(30) Foreign Application Priority Data

Sep. 9, 2019 (TW) ................................ 108132486

(51) Int. Cl.
*H01S 5/00* (2006.01)
*H01S 5/183* (2006.01)
(Continued)

(52) U.S. Cl.
CPC ............ *H01S 5/0042* (2013.01); *G01J 3/45* (2013.01); *G01N 21/55* (2013.01); *H01S 5/18305* (2013.01)

(58) Field of Classification Search
CPC .... H01S 5/0014; H01S 5/0021; H01S 5/0028; H01S 5/0035; H01S 5/0042; H01S 5/18305; G01J 3/45; G01N 21/55
See application file for complete search history.

(56) References Cited

U.S. PATENT DOCUMENTS

| 4,660,983 A * | 4/1987 | Yamamoto | G01N 21/55 356/124 |
| 9,112,331 B2 | 8/2015 | Northrup et al. | |
| 2002/0196431 A1* | 12/2002 | DeFelice | H01S 5/423 356/237.1 |

FOREIGN PATENT DOCUMENTS

TW 201345095 11/2013

OTHER PUBLICATIONS

Design and Characterization of Optically Pumped Vertical Cavity Surface Emitting Lasers, Bagnell, DTIC, Accession No. ADA258815, Air Force Inst of Tech Wright-Patterson AFB Oh School of Engineering, 1992 (Year: 1992).*

(Continued)

*Primary Examiner* — Tarifur R Chowdhury
*Assistant Examiner* — Jonathon Cook
(74) *Attorney, Agent, or Firm* — Amin, Turocy & Watson, LLP

(57) ABSTRACT

A measurement method for a vertical cavity surface emitting laser diode (VCSEL) and an epitaxial wafer test fixture are provided, especially the Fabry-Perot Etalon of the bottom-emitting VCSEL can be measured. When the Fabry-Perot Etalon of the bottom-emitting VCSEL is measured by a measurement apparatus, a light of the test light source of the measurement apparatus is incident from the substrate surface of the VCSEL epitaxial wafer such that the Fabry-Perot Etalon of the bottom-emitting VCSEL is acquired. Through the VCSEL epitaxial wafer test fixture, the bottom-emitting VCSEL can be directly measured by the existing measurement apparatus such that there is no need to change the optical design of the measurement apparatus, and it can prevent the VCSEL epitaxial wafer from being scratched or contaminated.

15 Claims, 11 Drawing Sheets

(51) Int. Cl.
    *G01N 21/55*    (2014.01)
    *G01J 3/45*     (2006.01)

(56) References Cited

OTHER PUBLICATIONS

C. J. O'Brien, M. L. Majewski and A. D. Rakic, "A Critical Comparison of High-Speed VCSEL Characterization Techniques," in Journal of Lightwave Technology, vol. 25, No. 2, pp. 597-605, Feb. 2007, doi: 10.1109/JLT.2006.889362. (Year: 2007).*

Y. C. Chung and Y. H. Lee, "Spectral characteristics of vertical-cavity surface-emitting lasers with external optical feedback," in IEEE Photonics Technology Letters, vol. 3, No. 7, pp. 597-599, Jul. 1991, doi: 10.1109/68.87925. (Year: 1991).*

P. D. Berger, Catherine Bru, Taha Benyattou, Andre L. Chenevas-Paule, and Philippe Grosse "Investigations of vertical cavity surface emitting lasers (VCSEL) resonant cavities by photoreflectance spectroscopy", Proc. SPIE 2397, Optoelectronic Integrated Circuit Materials, Physics, and Devices, (Year: 1995).*

O.M. Khreis, Modeling and analysis of smoothly diffused vertical cavity surface emitting lasers, Computational Condensed Matter, vol. 9, 2016,pp. 56-61, ISSN 2352-2143 (Year: 2016).*

\* cited by examiner

MEASUREMENT METHOD OF REFLECTION SPECTRUM OF VERTICAL CAVITY SURFACE EMITTING LASER DIODE (VCSEL) AND EPITAXIAL WAFER TEST FIXTURE

CROSS-REFERENCE TO RELATED APPLICATION

This application claims priority to Taiwanese Application Serial No. 108132486, filed on Sep. 9, 2019. The entirety of the above-mentioned patent application is hereby incorporated by reference herein and made a part of this specification.

TECHNICAL FIELD

The technical field relates to a measurement method of a reflection spectrum of a vertical cavity surface emitting layer diode (VCSEL) and an epitaxial wafer test fixture, especially suitable for measuring the Fabre-Perot Etalon of a bottom-emitting VCSEL.

BACKGROUND

A vertical cavity surface emitting laser diode (VCSEL) is gradually being widely used in sensing, optical communications or in infrared lighting.

According to the light emitting direction, VCSELs are divided into VCSELs with top emitting and bottom emitting. The existing optical measurement apparatus mainly includes a test light source, a signal receiving device and a platform. The VCSEL epitaxial wafer is placed on the platform, and the test light source is arranged above the platform.

The VCSEL epitaxial wafer includes a substrate and an epitaxial structure, and the epitaxial structure is epitaxially grown on the substrate. When measuring the VCSEL epitaxial wafer, the VCSEL epitaxial wafer is placed on the platform, and the substrate of the VCSEL epitaxial wafer is in contact with the platform. When transporting the VCSEL epitaxial wafer, the substrate thereof is also in contact with the robotic arm. In this way, the epitaxial structure is prevented from being contaminated or scratched by not contacting with the platform, the measuring platform or the robotic arm.

In the top-emitting VCSEL, the total reflectivity of the upper DBR layer is lower than that of the lower DBR layer. Since the total reflectivity of the upper DBR layer is lower, the light from the test light source will reach the resonant cavity more such that the measurement signal received by the signal receiving device is stronger, and it is easy to measure the Fabry-Perot Etalon in the reflection spectrum of the VCSEL.

However, in the bottom-emitting VCSEL, the total reflectivity of the upper DBR layer is higher than that of the lower DBR layer. When the total reflectivity of the upper DBR layer is too high, the light from the test light source will reach the resonant cavity less because most of the light from the test light source is reflected back by the upper DBR layer. As such, the signal received by the signal receiving device will be very small or as small as noise. Therefore, when noise interference occurs, the Fabry-Perot Etalon in the reflection spectrum will be difficult to be identified or even impossible to be identified.

For the top-emitting VCSEL, when the total reflectivity of the lower DBR layer is high enough, if the total reflectivity of the upper DBR layer is appropriately reduced, it may help to improve the performance of the top-emitting VCSEL.

In the bottom-emitting VCSEL, the total reflectivity of the upper DBR layer should be sufficiently high, and the performance of the bottom-emitting VCSEL will be better. However, limited by the existing optical measurement apparatus, the total reflectivity of the upper DBR layer of the bottom-emitting VCSEL cannot be too high. That is, the total reflectivity of the upper DBR layer needs to be reduced, but the performance of the bottom-emitting VCSEL is therefore limited.

Consequently, it is necessary to provide a measurement method, a measurement process and an epitaxial wafer test fixture for measuring the bottom-emitting VCSEL without reducing the total reflectivity of the upper DBR layer, without changing the existing optical measurement apparatus and without damaging the surface of the epitaxial structure of the VCSEL epitaxial wafer.

SUMMARY

A measuring method of reflection spectrum of a VCSEL is provided to measure the Fabry-Perot Etalon of a bottom-emitting VCSEL epitaxial wafer.

In one embodiment, the method for measuring the Fabry-Perot Etalon of a VCSEL epitaxial wafer includes: preparing a VCSEL epitaxial wafer, wherein the VCSEL epitaxial wafer has an epitaxial surface and a substrate surface opposite to the epitaxial surface; providing a measurement apparatus for measuring the VCSEL epitaxial wafer and generating a measurement result of the VCSEL epitaxial wafer, wherein the measurement apparatus includes a test light source, and the test light source is a broadband light source; irradiating the VCSEL epitaxial wafer by the broadband light source, wherein a light of the broadband light source is incident from the substrate surface of the VCSEL epitaxial wafer; and receiving the measurement result of the VCSEL epitaxial wafer, wherein the measurement result comprises a reflection spectrum including a Fabry-Perot Etalon wavelength.

In one embodiment, the method for measuring the Fabry-Perot Etalon of a bottom-emitting VCSEL epitaxial wafer at least includes the following steps: providing a bottom-emitting VCSEL epitaxial wafer, wherein the bottom-emitting VCSEL epitaxial wafer includes a substrate and an epitaxial region, the epitaxial region is formed on the substrate, and the bottom-emitting VCSEL epitaxial wafer has an epitaxial surface and a substrate surface opposite to the epitaxial surface; providing a measurement apparatus for measuring the bottom-emitting VCSEL epitaxial wafer and generating a measurement result of the bottom-emitting VCSEL epitaxial wafer, wherein the measurement apparatus includes a test light source, and the test light source is a broadband light source; placing the bottom-emitting VCSEL epitaxial wafer on an epitaxial wafer test fixture, wherein the substrate surface faces the test light source; measuring the bottom-emitting VCSEL epitaxial wafer by the measurement apparatus, wherein a light of the broadband light source is incident from the substrate surface of the VCSEL epitaxial wafer; and obtaining the measurement result of the bottom-emitting VCSEL epitaxial wafer, wherein the measurement result comprises a reflection spectrum including a Fabry-Perot Etalon wavelength.

In one embodiment, the epitaxial wafer test fixture supports the VCSEL epitaxial wafer in such a way that the test fixture is substantially in contact with the edge exclusion zone of the VCSEL epitaxial wafer, the epitaxial wafer test fixture does not contact the epitaxial surface or epitaxial layer of the VCSEL epitaxial wafer.

According to the above-mentioned measurement method, without changing the optical structure design of the existing measurement apparatus, the reflection spectrum of the bottom-emitting VCSEL can also be obtained by the existing measurement apparatus without contaminating or scratching the epitaxial layer of the VCSEL epitaxial wafer, and without reducing the total reflectivity of the upper DBR layer. In particular, the total reflectivity of the upper DBR layer of the bottom-emitting VCSEL may be higher than 0.9999, or higher than 0.9990, 0.9900, 0.9500 or 0.9000.

An epitaxial wafer test fixture which is used to support a VCSEL epitaxial wafer.

Persons skilled in the art will understand that the effects that can be achieved through the disclosure of the present invention are not limited to the content described above, and the advantages of the present invention will be more clearly understood from the aforesaid detailed description in conjunction with the accompanying drawings.

DESCRIPTION OF THE EMBODIMENTS

The embodiment of the present disclosure is described in detail below with reference to the drawings and element symbols, such that persons skilled in the art is able to implement the present application after understanding the specification of the present disclosure.

Figure 1:
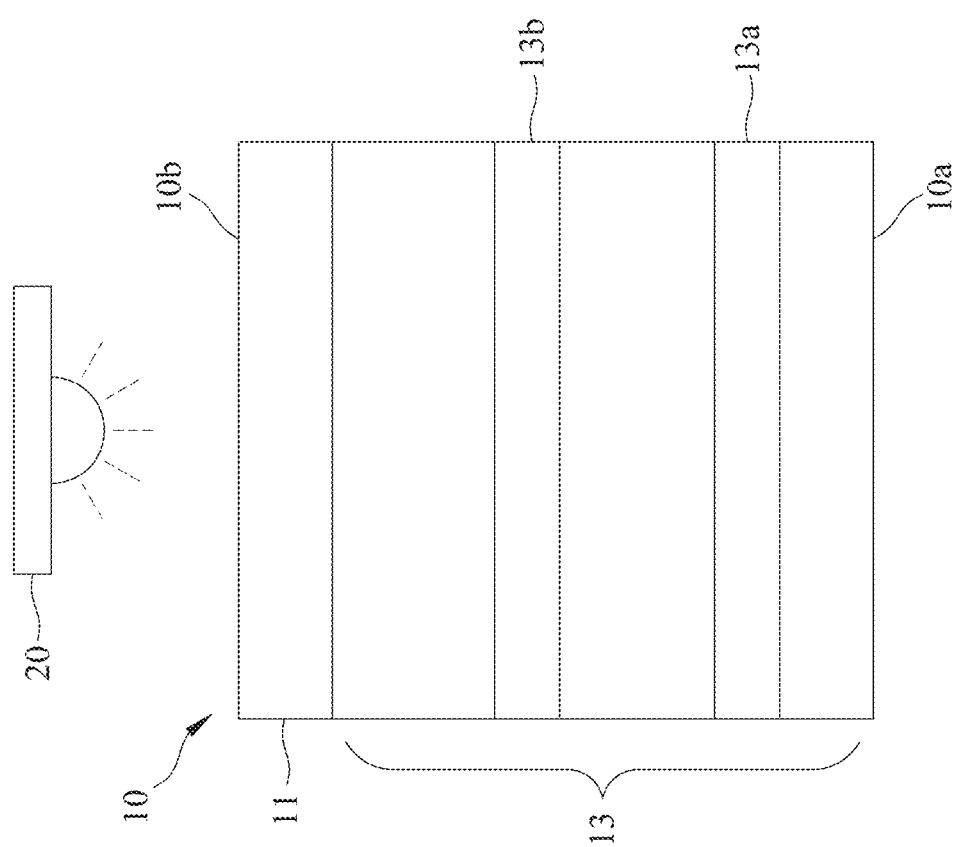
FIG. 1 is a schematic diagram of measuring a reflection spectrum of a bottom-emitting VCSEL epitaxial wafer according to one embodiment of the present disclosure.

As shown in FIG. 1, FIG. 1 shows a VCSEL epitaxial wafer 10 and a measurement apparatus (not shown) for measuring a reflection spectrum of the VCSEL epitaxial wafer. The VCSEL epitaxial wafer 10 is a bottom-emitting VCSEL epitaxial wafer.

The VCSEL epitaxial wafer 10 has an epitaxial surface 10$a$ and a substrate surface 10$b$ opposite to each other. The measurement apparatus is equipped with a test light source 20 and a signal receiving device (not shown). It should be noted that only the components related to the features of the embodiments are shown in the drawings, and other well-known components are not shown. That is, although the measurement apparatus also includes many components, such as the signal receiving device and other components, they are not displayed and do not affect the following description The test light source 20 and the signal receiving device are usually arranged on the upper side of the measurement apparatus, and the object to be measured is placed on the lower side of the measurement apparatus, that is, the object to be measured is positioned under the test light source 20 and the signal receiving device. Therefore, "a light of the test light source is incident from the substrate surface 10$b$ of the VCSEL epitaxial wafer 10."

It should be noted that the test light source 20 and the signal receiving device of the measurement apparatus are not necessarily just above the substrate as shown in FIG. 1. In principle, as long as the light emitted by the test light source 20 can be incident directly or indirectly from the substrate of the VCSEL, the test light source 20 and/or the signal receiving can also be arranged in other suitable positions.

The aforementioned expression "a light of the light source is incident from the substrate of the VCSEL" means that a light of the light source firstly passes through the substrate and then enters the epitaxial region.

Referring to FIG. 1, the structure of the VCSEL epitaxial wafer 10 includes the substrate 11 and the epitaxial region 13. The epitaxial region 13 can be grown on one surface of the substrate 11 by metal organic chemical vapor deposition (MOCVD), Molecular Beam Epitaxy (MBE) or other epitaxial growth methods.

The epitaxial region 13 usually includes multiple epitaxial layers. The epitaxial region 13 at least includes an upper DBR layer 13$a$, a lower DBR layer 13$b$ and active region. The total reflectivity of the upper DBR layer 13$a$ is greater than that of the lower DBR layer 13$b$. Preferably, the total reflectivity of the lower DBR layer is approximately less than 0.9999, or the total reflectivity of the lower DBR layer is approximately between 0.9999 and 0.9000. For example, the total reflectivity of the lower DBR layer may be 0.9990, 0.9900, 0.9500 or 0.9000. However, the total reflectivity of the lower DBR layer may be slightly higher than 0.9999 or slightly lower than 0.9000 according to the performance of the VCSEL.

One typical multiple epitaxial layers includes a buffer layer, a lower DBR layer, a lower spacer layer, an active layer, an upper spacer layer, an upper DBR layer and an ohmic contact layer.

In some embodiments, the test light source 20 may be a broadband light source, such as white light.

The epitaxial surface herein is the surface of the epitaxial region that is farther away from the substrate and is not in contact with the substrate. The substrate surface is the surface of the substrate that is farther away from the epitaxial region and is not in contact with the epitaxial region, the "epitaxial surface 10$a$" and the "substrate surface 10$b$" can be the top and bottom surfaces of the VCSEL epitaxial wafer 10, respectively. From the perspective of FIG. 1, the "epitaxial surface 10a" and the "substrate surface 10b" are the bottom and top surfaces of the VCSEL epitaxial wafer 10.

Figure 2:
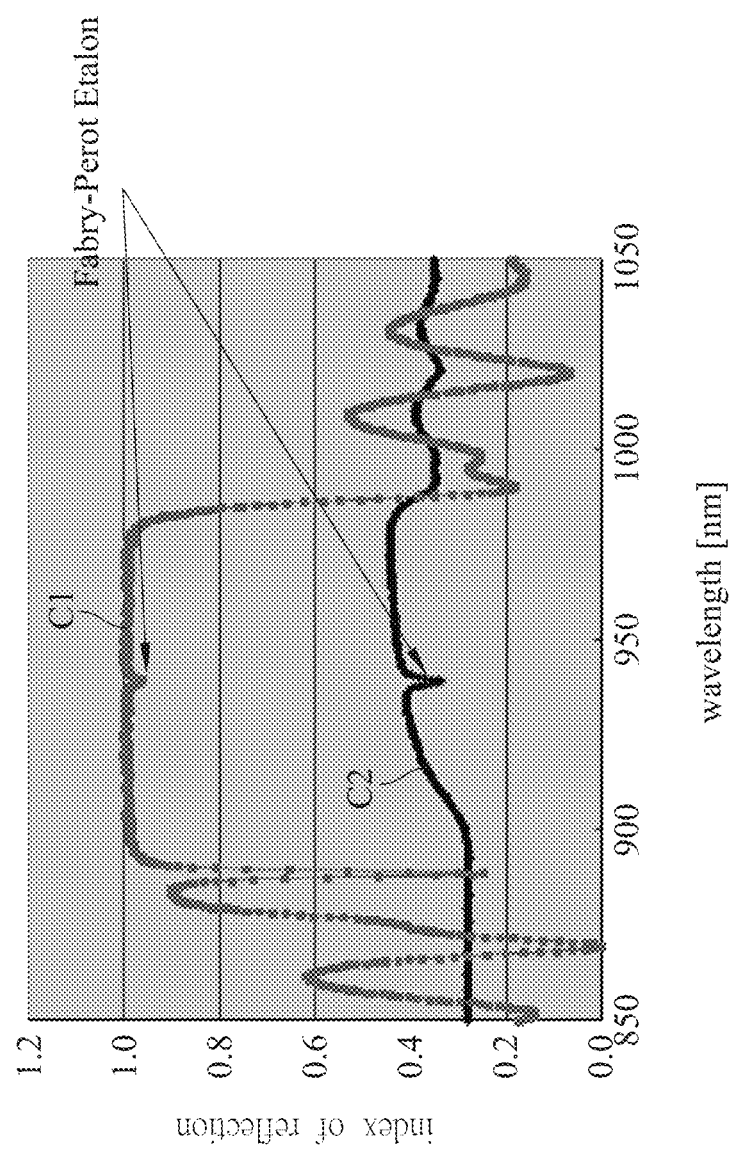
FIG. 2 is a comparison diagram showing the reflection spectrum of the bottom-emitting VCSEL epitaxial wafer according to a first embodiment.

Referring to FIG. 2, FIG. 2 shows a comparison diagram of the reflection spectrum of the bottom-emitting VCSEL epitaxial wafer according to the first embodiment. The VCSEL epitaxial wafer includes an N-type doped GaAs substrate and an epitaxial region, wherein the epitaxial region is epitaxially grown on the N-type doped GaAs substrate. As shown in FIG. 2, the test curve C1 represents the reflection spectrum measured when the test light source 20 is incident from the epitaxial surface, and the test curve C2 represents the reflection spectrum measured when the test light source 20 is incident from the substrate surface.

As shown in the test curve C1, although the Fabry-Perot Etalon is measured near the wavelength of 940 nm, the signal of the Fabry-Perot Etalon is relatively insignificant (that is, the reflectivity intensity of the Fabry-Perot Etalon is not low enough). Hence, the reflectivity intensity of the Fabry-Perot Etalon has a small difference with the reflectivity intensity of wavelengths near the Fabry-Perot Etalon. As a result, the Fabry-Perot Etalon is not easy to identify. As shown in the test curve C2, the Fabry-Perot Etalon is measured around the wavelength of 940 nm. Since the signal of the Fabry-Perot Etalon is relatively obvious (that is, the reflectivity intensity of the Fabry-Perot Etalon is sufficiently low), the reflectivity intensity of the Fabry-Perot Etalon is significantly different from the reflectivity intensity of wavelengths near the Fabry-Perot Etalon such that the Fabry-Perot Etalon is easy to identify.

According to FIG. 2, when the substrate is an N-type doped GaAs substrate (i.e, an N+ GaAs substrate), and when the light of the test light source 20 is incident from the substrate surface, the N+ GaAs substrate absorbs the incident light with a wavelength less than 900 nm such that the Fabry-Perot Etalon wavelength measured in the reflection spectrum is about 900 nm or more.

Figure 3:
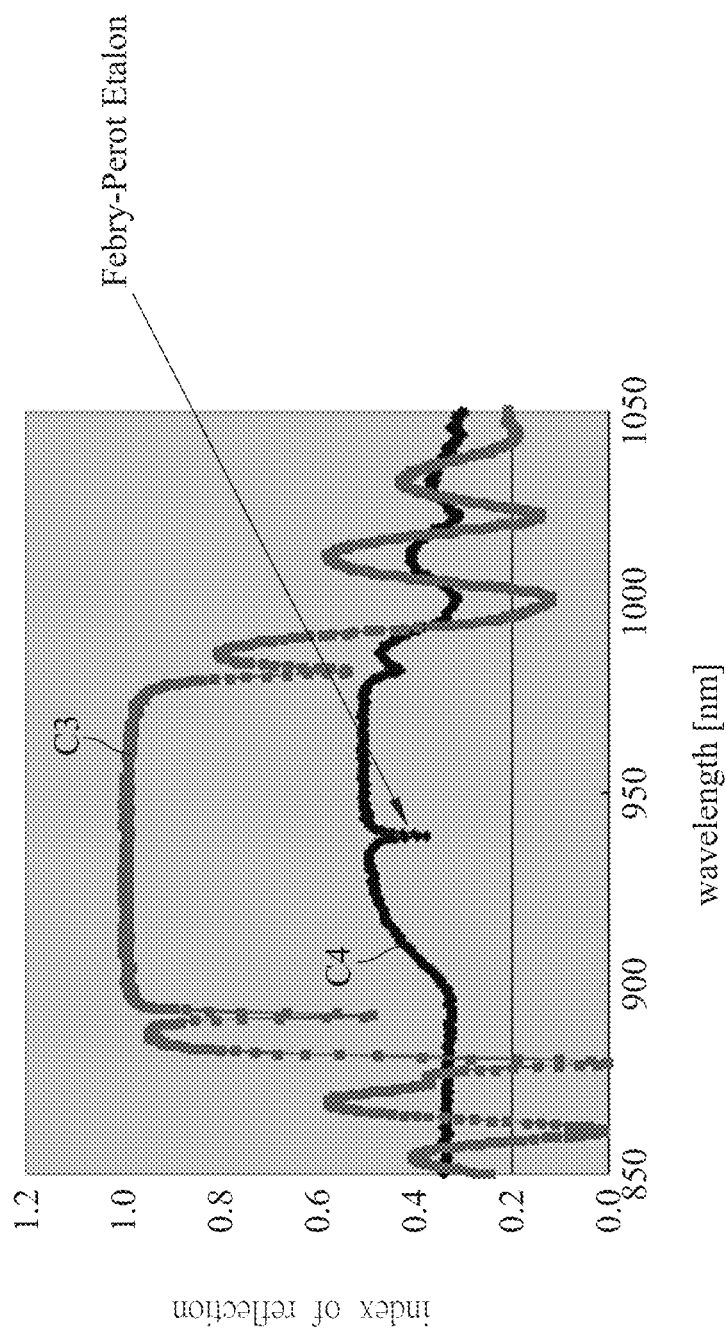
FIG. 3 is a comparison diagram showing the reflection spectrum of another bottom-emitting VCSEL epitaxial wafer according to a second embodiment.

Referring to FIG. 3, FIG. 3 shows a comparison diagram of the reflection spectrum of bottom-emitting VCSEL epitaxial wafer according to the second embodiment. The bottom-emitting VCSEL epitaxial wafer also include an N-type doped GaAs substrate and an epitaxial region, wherein the epitaxial region is epitaxially grown on an N-type doped GaAs substrate. Moreover, the total reflectivity of the upper DBR layer of the bottom-emitting VCSEL epitaxial wafer of FIG. 3 is greater than that of the upper DBR layer of the VCSEL epitaxial wafer of FIG. 2. As shown in FIG. 3, the test curve C3 represents the reflection spectrum measured when the light of the test light source 20 is incident from the epitaxial surface, and the test curve C4 represents the reflection spectrum measured when the light of the test light source 20 is incident from the substrate surface.

As shown in the test curve C3 of FIG. 3, when the light of the test light source 20 is incident from the epitaxial surface, the Fabry-Perot Etalon wavelength is not detected at a wavelength of about 940 nm. However, when the light of the test light source 20 is incident from the substrate surface, as shown in the test curve C4 of FIG. 3, an obvious Fabry-Perot Etalon wavelength can be measured at a wavelength of about 940 nm.

According to FIG. 3, when the substrate is an N-type doped GaAs substrate (i.e., an N+ GaAs substrate), and when the light of the test light source is incident from the substrate surface, the N+ GaAs substrate absorbs the incident light with a wavelength less than 900 nm such that the Fabry-Perot Etalon wavelength measured in the reflection spectrum is about 900 nm or more.

Figure 4:
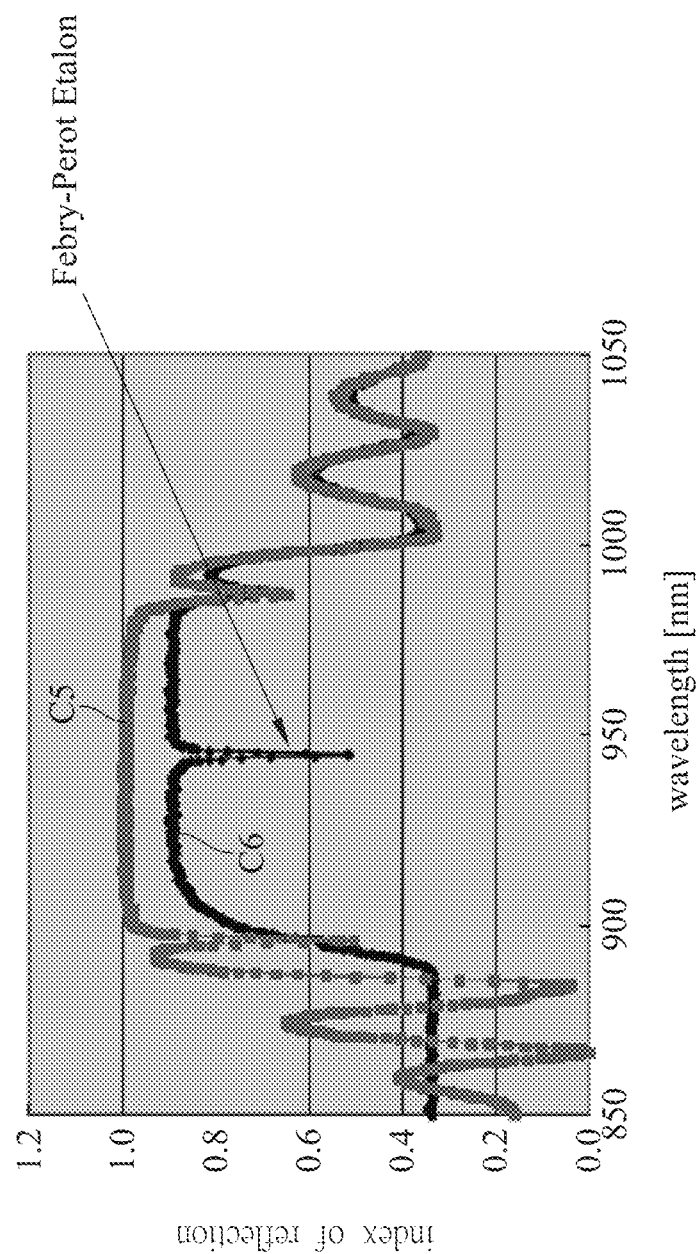
FIG. 4 is a comparison schematic diagram showing the reflection spectrum of the bottom-emitting VCSEL epitaxial wafer according to a third embodiment the present disclosure.

Referring to FIG. 4, FIG. 4 illustrates a comparison diagram of the reflection spectrum of a bottom-emitting VCSEL epitaxial wafer according to the third embodiment. As shown in FIG. 4, the VCSEL epitaxial wafer includes a semi-insulating GaAs substrate and an epitaxial region, wherein the epitaxial region is epitaxially grown on the semi-insulating GaAs substrate. The total reflectivity of the upper DBR layer of the VCSEL epitaxial wafer of FIG. 4 is the same as that of the upper DBR layer of the VCSEL epitaxial wafer of FIG. 3. As shown in FIG. 4, the test curve C5 represents the reflection spectrum measured when the light of the test light source 20 is incident from the epitaxial surface, and the test curve C6 represents the reflection spectrum measured when the light of the test light source 20 is incident from the substrate surface.

As shown in the test curve C5 of the FIG. 4, when the light of the test light source 20 is incident from the epitaxial surface, the Fabry-Perot Etalon wavelength is not measured at a wavelength of about 950 nm. However, when the light of the test light source 20 is incident from the substrate surface, as shown in the test curve C6 of FIG. 4, an obvious Fabry-Perot Etalon wavelength can be measured at a wavelength of about 950 nm.

According to FIG. 4, when the substrate is a semi-insulating GaAs substrate (i.e., a SI GaAs substrate), and when the light of the test light source is incident from the substrate surface, the SI GaAs substrate absorbs the incident light with a wavelength less than 890 nm such that the Fabry-Perot Etalon wavelength measured in the reflection spectrum is about 890 nm or more.

An epitaxial wafer test fixture and a measurement method using the epitaxial wafer test fixture are further provided. Through the epitaxial wafer test fixture and the measurement method using the epitaxial wafer test fixture, a clearly identifiable Fabry-Perot Etalon in the reflection spectrum can be obtained by measuring the bottom-emitting VCSEL epitaxial wafer with the existing measurement apparatus. The reflectivity of the upper DBR layer of the bottom-emitting VCSEL epitaxial wafer can be very high.

Figure 5:
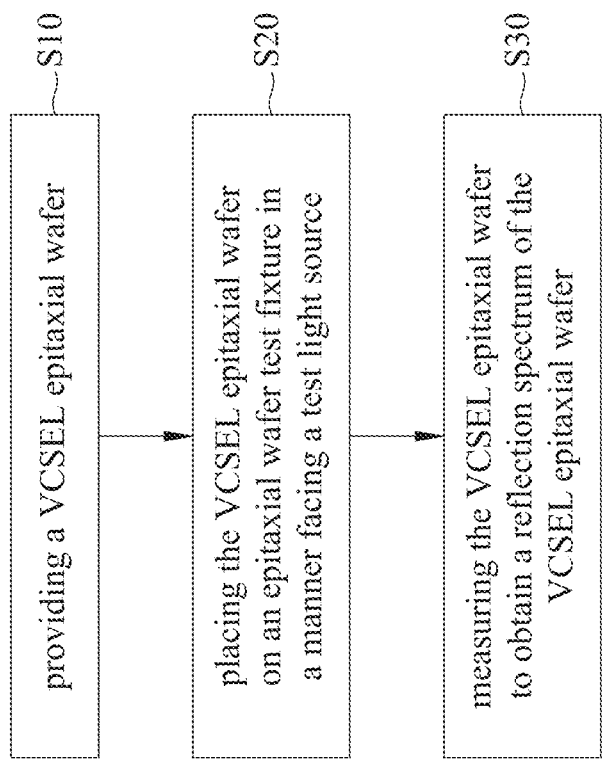
FIG. 5 is a schematic diagram of a measurement process of the reflection spectrum of the VCSEL epitaxial wafer according to one embodiment of the present disclosure.
Figure 6A:
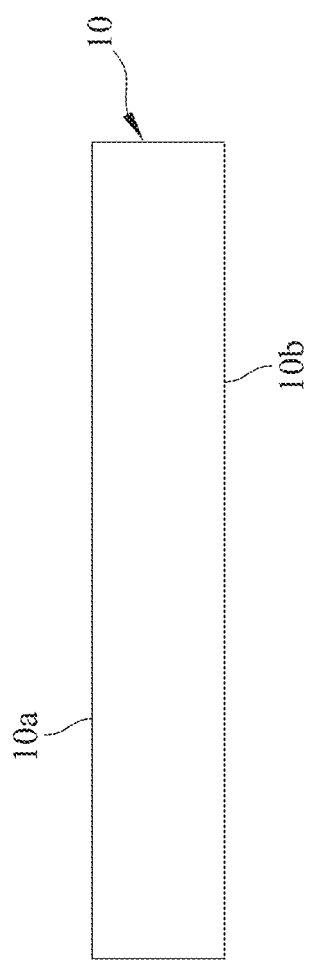
FIG. 6a is a schematic diagram of a VCSEL epitaxial wafer according to the present disclosure.

Referring to FIG. 5, FIG. 5 is a schematic diagram of a measurement process of a reflection spectrum of a VCSEL epitaxial wafer according to one embodiment of the present disclosure. First, go to step S10 and cooperate with FIG. 6a, a VCSEL epitaxial wafer 10 is provided. The VCSEL epitaxial wafer 10 is a bottom-emitting VCSEL epitaxial wafer. The VCSEL epitaxial wafer 10 includes an epitaxial surface and a substrate surface opposite to each other. For the bottom-emitting VCSEL epitaxial wafer 10, the total reflectivity of the upper DBR layer is greater than that of the lower DBR layer. The total reflectivity of the lower DBR layer is approximately less than 0.9999, or the total reflectivity of the lower DBR layer is approximately between 0.9999 and 0.9000. For example, the total reflectivity of the lower DBR layer may be 0.9990, 0.9900, 0.9500 or 0.9000. However, the total reflectivity of the lower DBR layer may be adjusted appropriately according to the performance of the VCSEL.

Figure 6B:
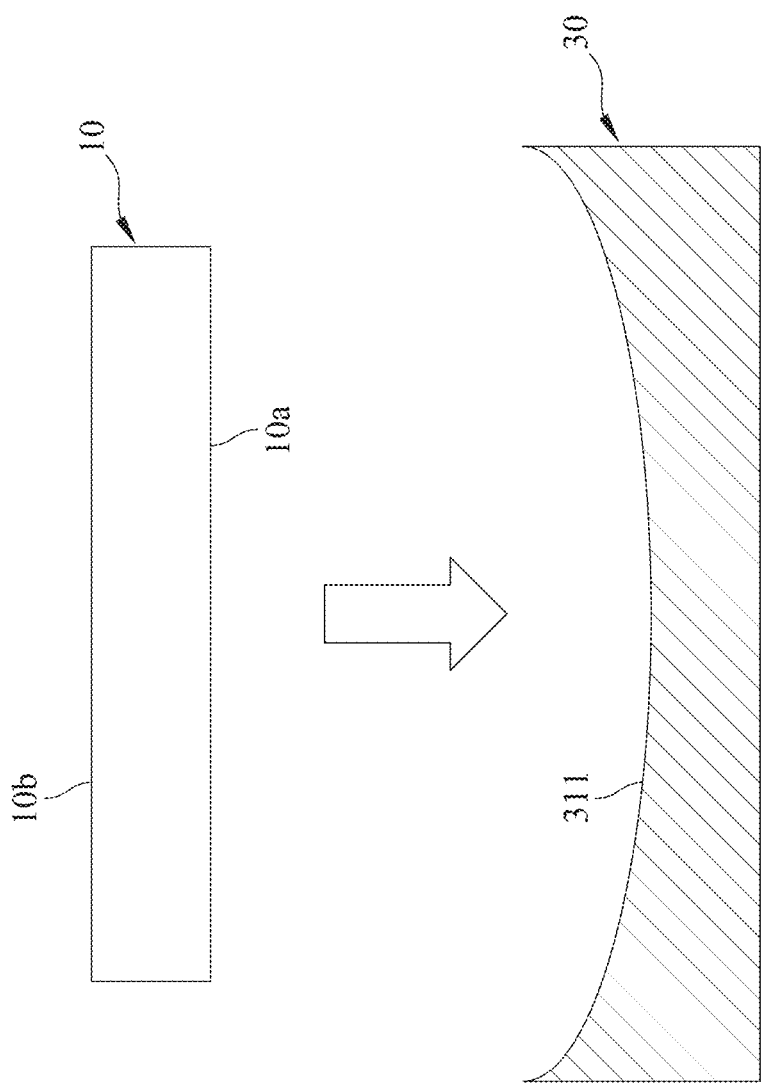
FIG. 6b is a schematic diagram of an epitaxial wafer test fixture supporting the VCSEL epitaxial wafer according to the present disclosure.

After that, go to step S20 and cooperate with FIG. 6b, the VCSEL epitaxial wafer 10 is placed on the epitaxial wafer test fixture 20 in a manner that the substrate surface 10b of the VCSEL epitaxial wafer 10 faces the test light source 20.

Finally, proceed to step S30 and cooperate with FIG. 1, the VCSEL epitaxial wafer 10 is measured. Light of the test light source 20 illuminates the VCSEL epitaxial wafer 10, and the light of the test light source 20 is incident from the substrate surface 10 to obtain a reflection spectrum of the VCSEL epitaxial wafer 10 and the Fabry-Perot Etalon wavelength in the reflection spectrum.

When the light of the test light source 20 of the measurement apparatus is projected downward, the substrate surface 10b of the bottom-emitting VCSEL epitaxial wafer 10 should be directed upward.

In one embodiment, the epitaxial wafer test fixture may be firstly placed in the measurement apparatus, and then the bottom-emitting VCSEL epitaxial wafer is placed on the epitaxial wafer test fixture in the measurement apparatus such that step S30 is performed.

In one embodiment, the bottom-emitting VCSEL epitaxial wafer is hold by the epitaxial wafer test fixture. After that, the bottom-emitting VCSEL epitaxial wafer together with the epitaxial wafer test fixture is placed in the measurement apparatus for performing step S30.

In one embodiment, the epitaxial wafer test fixture 30 holds the bottom-emitting VCSEL epitaxial wafer 10 by substantially supporting the edge exclusion zone of the VCSEL epitaxial wafer 10. The epitaxial wafer test fixture 30 do not contact the non-edge exclusion zone of the epitaxial surface 10a of the VCSEL epitaxial wafer 10. As such, contamination or scratches on the non-edge exclusion zone are avoided.

The material of the epitaxial wafer test fixture 30 is preferably a material that is not easy to scratch the VCSEL epitaxial wafer 10, such as Teflon, plastic, acrylic, glass fiber or other similar materials.

Figure 7:
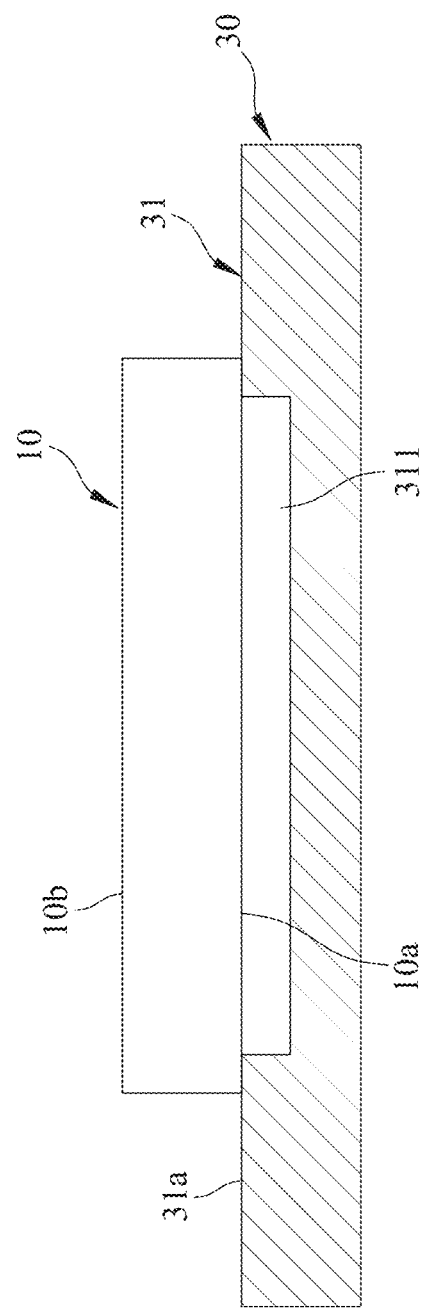
FIG. 7 is a schematic diagram of the epitaxial wafer test fixture according to one embodiment of the present disclosure.

Referring to FIG. 7, FIG. 7 is a schematic diagram of an epitaxial wafer test fixture according to one embodiment of the present disclosure. As shown in FIG. 7, the epitaxial wafer test fixture 30 includes a fixture body 31. The fixture body 31 includes a recess 311, and the recess 311 has an inner space. The recess 311 is formed on the side of the fixture body 31 that supports the VCSEL epitaxial wafer 10. For example, the recess 311 is formed in the middle area of the top surface 31a of the fixture body 31.

The fixture body 31 with the recess 311 (such as a groove) can support a bottom-emitting VCSEL epitaxial wafer or a top-emitting VCSEL epitaxial wafer. When the fixture body 31 supports the bottom-emitting VCSEL epitaxial wafer 10, since the epitaxial surface 10a of the VCSEL epitaxial wafer 10 faces the recess 311, the epitaxial surface of the VCSEL epitaxial wafer will contact the fixture body 31. In this case, the edge exclusion zone of the epitaxial surface 10a is in contact with the supporting surface of the fixture body 31 such that the non-edge zone of the epitaxial surface 10a of the VCSEL epitaxial wafer 10 corresponds to the inner space of the recess 311. Accordingly, the non-edge zone of the epitaxial surface 10a of the VCSEL epitaxial wafer 10 does not contact the fixture body, thereby preventing the non-edge zone of the epitaxial surface 10a of the VCSEL epitaxial wafer 10 from being contaminated or scratched.

When the fixture body 31 supports the top-emitting VCSEL epitaxial wafer 10, since the substrate surface of the VCSEL epitaxial wafer 10 is in contact with the fixture body 31, the part of or the entire of the substrate surface can be attached to the fixture body. It is also possible to allow the robotic arm to extend into the inner space of the fixture body, and then take out the top-emitting VCSEL epitaxial wafer from the fixture body, or move the top-emitting VCSEL epitaxial wafer to the fixture body. In addition, a transferring device such as a robotic arm can also indirectly achieve the purpose of moving the VCSEL epitaxial wafer by transporting the fixture body.

Figure 10:
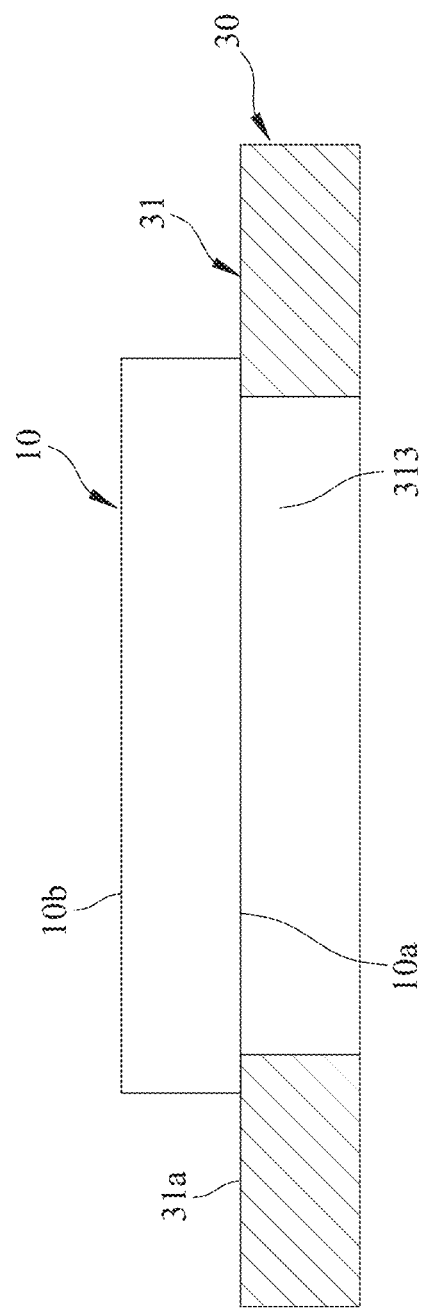
FIG. 10 is a schematic diagram of the epitaxial wafer test fixture according to the other preferred embodiment of the present disclosure.

The recess 311 of the fixture body 31 may be formed by subtractive process on the fixture body 31. For example, a groove is formed on the surface of the fixture body 31, as shown in FIG. 7, but not limited thereto. In addition, the recess may also be formed through an additive process (processing). For example, a support with a certain height (not shown) is provided on the surface of the fixture body 31, and the surface of the support is the aforesaid supporting surface. Alternatively, the portion of the fixture body 31 corresponding to the non-edge area of the epitaxial surface is penetrated, such as a fixture body having a through hole (referring to FIG. 10) or multiple through holes.

Figure 8:
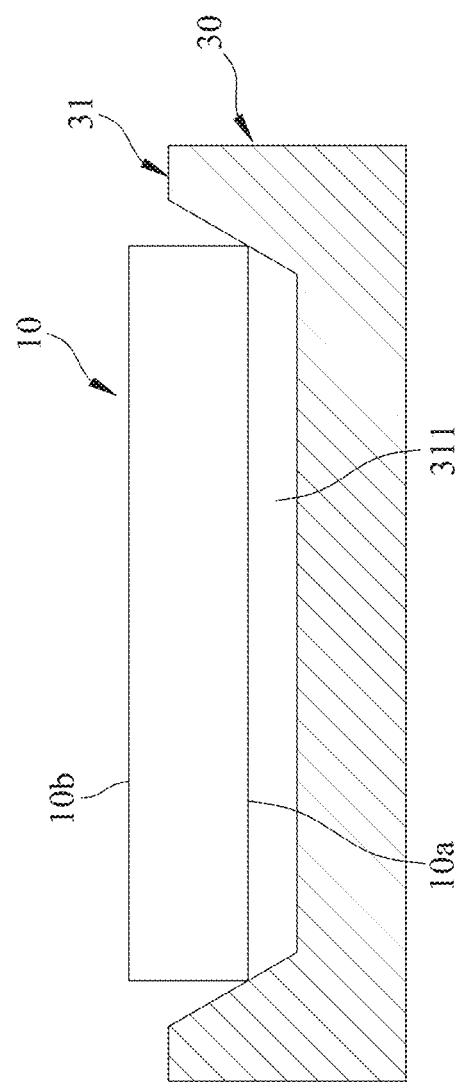
FIG. 8 is a schematic diagram of the epitaxial wafer test fixture according to one preferred embodiment of the present disclosure.

In some embodiments, the recess 311 of the fixture body 31 is wide in the upper portion and narrow in the lower portion. Referring to FIG. 8, FIG. 8 is a schematic diagram of an epitaxial wafer test fixture according to a preferred embodiment of the present disclosure. FIG. 8 shows a method of positioning the VCSEL epitaxial wafer 10. As shown in FIG. 8, the recess 311 in the fixture body 31 is generally trapezoidal, and the outer periphery of the VCSEL epitaxial wafer 10 is positioned in the recess 311 against the inner side wall of the recess 311.

Figure 9:
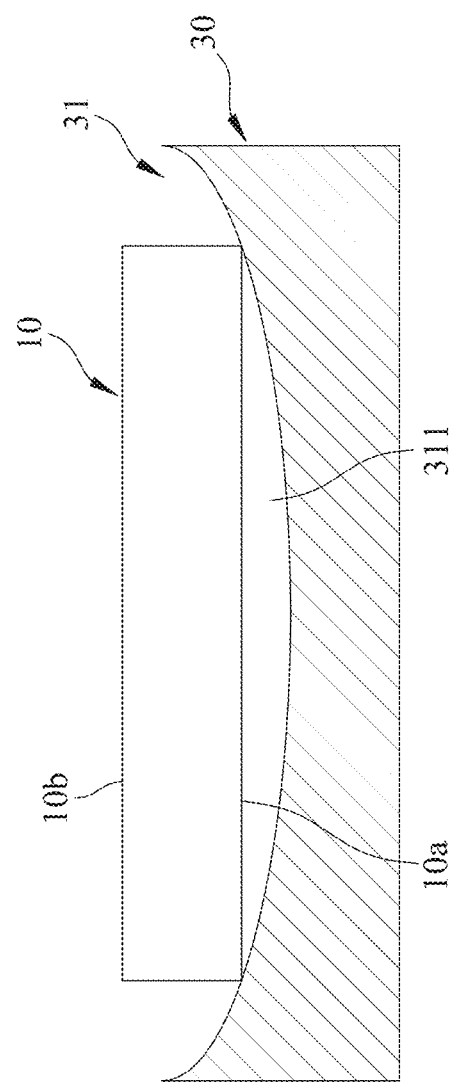
FIG. 9 is a schematic diagram of the epitaxial wafer test fixture according to another preferred embodiment of the present disclosure.

Referring to FIG. 9, FIG. 9 is a schematic diagram of an epitaxial wafer test fixture according to another preferred embodiment of the present disclosure. FIG. 9 shows another way of positioning the VCSEL epitaxial wafer 10. As shown in FIG. 9, the inner wall surface of the recess 311 in the fixture body 31 has a curvature. For instance, the recess 311 has a cone shape, a bowl shape or other appropriate shapes. The edge exclusion area of the VCSEL epitaxial wafer 10 is located against the inner side wall of the recess 311 so as to be positioned in the recess 311.

In one embodiment, the thickness of the fixture body does not exceed 10 cm.

In one embodiment, the thickness of the fixture body is between 0.1 cm and 10 cm or between 0.5 cm and 10 cm.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A measurement method for a vertical cavity surface emitting laser diode (VCSEL), the measurement method comprising:
preparing a VCSEL epitaxial wafer, wherein the VCSEL epitaxial wafer has an epitaxial surface and a substrate surface opposite to the epitaxial surface;
providing a measurement apparatus for measuring the VCSEL epitaxial wafer and generating a measurement result of the VCSEL epitaxial wafer, wherein the measurement apparatus includes a test light source, and the test light source is a broadband light source;
placing the VCSEL epitaxial wafer on an epitaxial wafer test fixture, wherein the VCSEL epitaxial wafer test fixture includes a fixture body, one surface of the VCSEL epitaxial wafer is the epitaxial surface, the epitaxial surface includes an edge exclusion zone and a non-edge exclusion zone, the VCSEL epitaxial wafer is positioned on the fixture body by the edge exclusion zone abutting against the fixture body, and the non-edge exclusion zone of the VCSEL epitaxial wafer does not contact the fixture body;
irradiating the VCSEL epitaxial wafer by the broadband light source, wherein a light of the broadband light source is incident from the substrate surface of the VCSEL epitaxial wafer; and receiving the measurement result of the VCSEL epitaxial wafer, wherein the measurement result comprises a reflection spectrum including a Fabry-Perot Etalon wavelength.

2. The measurement method for the VCSEL as claimed in claim 1, wherein the VCSEL epitaxial wafer includes an upper DBR layer and a lower DBR layer, total reflectivity of the upper DBR layer is greater than that of the lower DBR layer, and the total reflectivity of the lower DBR layer is not greater than 0.9999.

3. The measurement method for the VCSEL as claimed in claim 1, wherein the broadband light source is white light.

4. The measurement method for the VCSEL as claimed in claim 1, wherein the VCSEL epitaxial wafer comprises a substrate, and the substrate is a semi-insulating substrate.

5. The measurement method for the VCSEL as claimed in claim 4, wherein the substrate is a GaAs substrate, and the Fabry-Perot Etalon wavelength is greater than 890 nm.

6. The measurement method for the VCSEL as claimed in claim 1, wherein the VCSEL epitaxial wafer comprises a substrate, and the substrate is an N-type or P-type doped substrate.

7. The measurement method for the VCSEL as claimed in claim 6, wherein the substrate is a GaAs substrate, and the Fabry-Perot Etalon wavelength is greater than 900 nm.

8. A measurement method for a bottom-emitting vertical cavity surface emitting laser diode (VCSEL), the measurement method comprising:

providing a bottom-emitting VCSEL epitaxial wafer, wherein the bottom-emitting VCSEL epitaxial wafer includes a substrate and an epitaxial region, the epitaxial region is formed on the substrate, and the bottom-emitting VCSEL epitaxial wafer has an epitaxial surface and a substrate surface opposite to the epitaxial surface;

providing a measurement apparatus for measuring the bottom-emitting VCSEL epitaxial wafer and generating a measurement result of the bottom-emitting VCSEL epitaxial wafer, wherein the measurement apparatus includes a test light source, and the test light source is a broadband light source;

placing the bottom-emitting VCSEL epitaxial wafer on an epitaxial wafer test fixture, wherein the substrate surface faces the test light source, and wherein the VCSEL epitaxial wafer test fixture includes a fixture body, one surface of the bottom-emitting VCSEL epitaxial wafer is the epitaxial surface, the epitaxial surface includes an edge exclusion zone and a non-edge exclusion zone, the bottom-emitting VCSEL epitaxial wafer is positioned on the fixture body by the edge exclusion zone abutting against the fixture body, and the non-edge exclusion zone of the VCSEL epitaxial wafer does not contact the fixture body;

measuring the bottom-emitting VCSEL epitaxial wafer by the measurement apparatus, wherein a light of the broadband light source is incident from the substrate surface of the VCSEL epitaxial wafer; and obtaining the measurement result of the bottom-emitting VCSEL epitaxial wafer, wherein the measurement result comprises a reflection spectrum including a Fabry-Perot Etalon wavelength.

9. The measurement method for the bottom-emitting VCSEL as claimed in claim 8, wherein the epitaxial wafer test fixture is substantially in contact with edge of the bottom-emitting VCSEL epitaxial wafer so as to hold the bottom-emitting VCSEL epitaxial wafer.

10. The measurement method for the bottom-emitting VCSEL as claimed in claim 8, wherein the bottom-emitting VCSEL epitaxial wafer includes an upper DBR layer and a lower DBR layer, total reflectivity of the upper DBR layer is greater than that of the lower DBR layer, and the total reflectivity of the lower DBR layer is not greater than 0.9999.

11. The measurement method for the bottom-emitting VCSEL as claimed in claim 8, wherein the broadband light source is white light.

12. The measurement method for the bottom-emitting VCSEL as claimed in claim 8, wherein the bottom-emitting VCSEL epitaxial wafer comprises a substrate, and the substrate is a semi-insulating substrate.

13. The measurement method for the bottom-emitting VCSEL as claimed in claim 12, wherein the substrate is a GaAs substrate, and the Fabry-Perot Etalon wavelength is greater than 890 nm.

14. The measurement method for the bottom-emitting VCSEL as claimed in claim 8, wherein the bottom-emitting VCSEL epitaxial wafer comprises a substrate, and the substrate is an N-type or P-type doped substrate.

15. The measurement method for the bottom-emitting VCSEL as claimed in claim 14, wherein the substrate is a GaAs substrate, and the Fabry-Perot Etalon wavelength is greater than 900 nm.

* * * * *